United States Patent [19]

Stange

[11] 4,135,105
[45] Jan. 16, 1979

[54] LOCKED FREQUENCY DIVIDER, MULTIPLIER AND PHASE SHIFTER

[75] Inventor: Thomas P. Stange, Scottsdale, Ariz.

[73] Assignee: Motorola, Inc., Schaumburg, Ill.

[21] Appl. No.: 791,675

[22] Filed: Apr. 28, 1977

Related U.S. Application Data

[63] Continuation of Ser. No. 646,683, Jan. 5, 1976, abandoned.

[51] Int. Cl.$^2$ .............................................. H03K 21/00
[52] U.S. Cl. .................................. 307/225 R; 328/30; 328/38; 328/39
[58] Field of Search ........... 307/220 R, 225 R, 225 B, 307/225 C, 262; 328/39, 40, 30, 38, 46, 41

[56] References Cited

U.S. PATENT DOCUMENTS

| 3,061,742 | 10/1962 | Harrison | 307/225 R |
| 3,113,221 | 12/1963 | Okuda | 307/225 R |
| 3,505,536 | 4/1970 | Vittoz | 307/225 R |
| 3,838,344 | 9/1974 | Tanimoto | 307/225 R |

Primary Examiner—John Zazworsky
Attorney, Agent, or Firm—M. David Shapiro

[57] ABSTRACT

A locked frequency divider, multiplier and phase shifter includes a circuitry for controlling the operation of a timer with timing circuitry to operate in an astable mode so that the timer can function as a frequency divider, multiplier or phase shifter.

3 Claims, 2 Drawing Figures

LOCKED FREQUENCY DIVIDER, MULTIPLIER AND PHASE SHIFTER

This is a continuation of application Ser. No. 646,683, filed Jan. 5, 1976, now abandoned.

BACKGROUND OF THE INVENTION

This invention relates to a circuitry that can function either as a divider or multiplier or phase shifter.

PRIOR ART

Frequency divider, multiplier or phase shifter is extensively used in many of the electronic applications and has been the subject matter of an extensive development work. Heretofore, generally the circuitry for providing these functions has been limited in the sense that a circuitry is principally designed to provide only one or the other of these functions. That is, the circuitry is designed either to provide the frequency multiplying or dividing or phase shifting functions but is very rarely designed to provide all of these functions without extensive modifications and addition of extra circuit elements.

SUMMARY OF THE INVENTION

It is therefore an object of the present invention to provide a single improved circuitry that can provide various types of aforementioned functions.

It is another object of the present invention to provide an improved circuitry that can provide the frequency dividing, multiplying and phase shifting functions.

The aforementioned and other objects are achieved, in accordance with the present invention, by providing a control circuitry of a novel design that controls the operation of timer of a conventional design. The timer may be of a conventional design that operates with an RC or some other type of timing circuitry in an astable mode for providing a train of output pulses of a predetermined repetition rate where the repetition rate is essentially determined by the timing circuitry.

Advantageously in accordance with the present invention, the control circuitry of the novel design is interposed between an input signal and the timer wherein the control circuitry is designed to enable the timer to multiply or divide the input signal frequency according to the ratio between the input signal frequency and the frequency of the train of the output pulses of the timer by even or uneven integers.

The aforementioned and other features of the present invention will become clearer from the following detailed description of an illustrative embodiment of the present invention in conjunction with the accompanying drawings in which.

DETAILED DESCRIPTION

Figure 1:
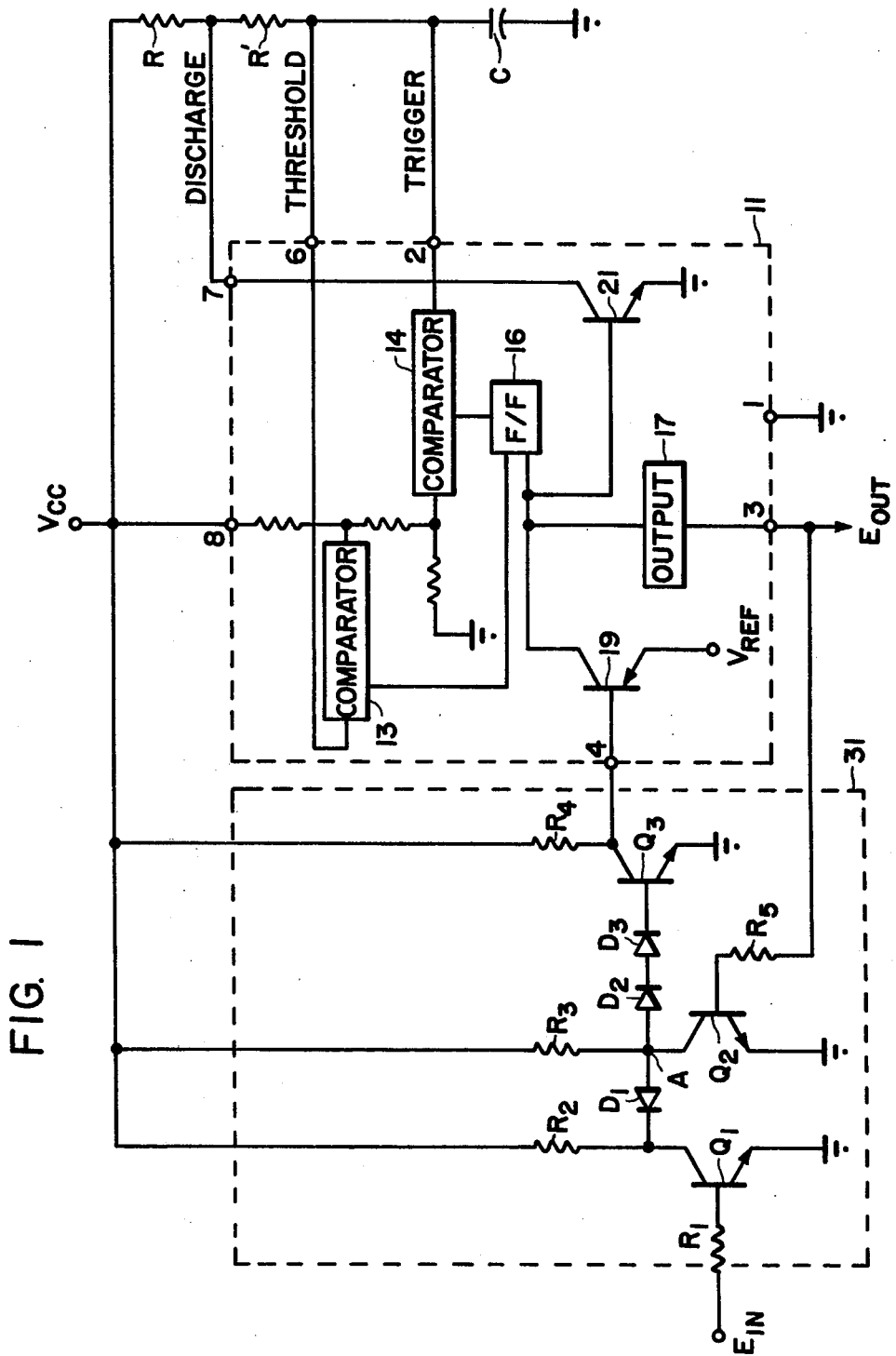
FIG. 1 shows a schematic diagram of a locked frequency divider, multiplier and phase shifter illustrative of the present invention.

FIG. 1 illustrates a circuitry which can function as a locked frequency divider, multiplier or phase shifter in accordance with the present invention. As illustrated the circuitry includes a timer 11 of a conventional design. The timer is configured to operate with a suitable timing circuitry such as an RC timing circuitry, (R and R' and C) in an astable mode to provide a train of output pulses of a predetermined repetition rate. Such a timer is widely available and has become a standard electronic circuitry part. One may obtain such a timer from Motorola, Inc., known as the Motorola 555 Timer with the product identification MC1455 or MC1555.

Figure 2:
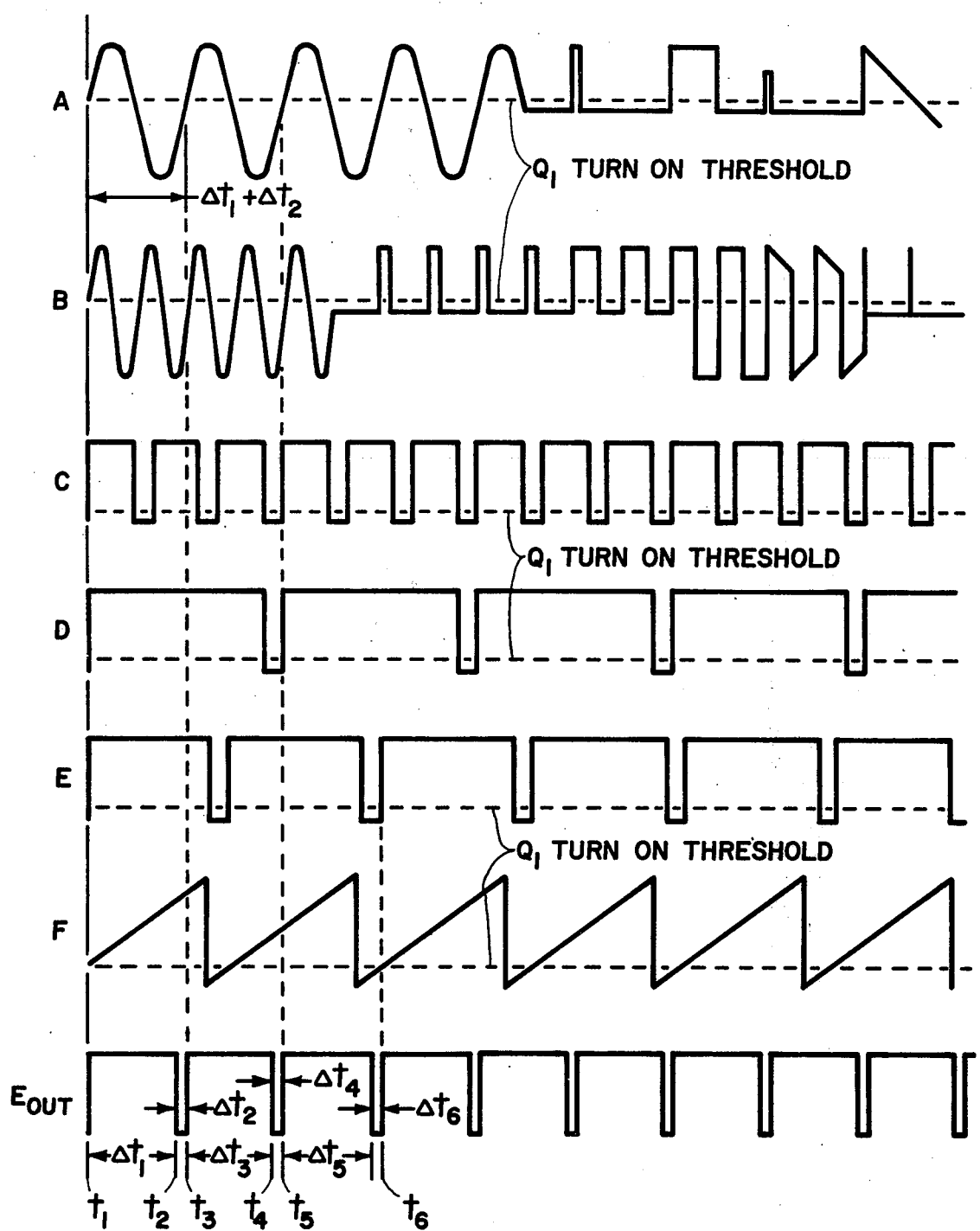
FIG. 2 shows various wave forms illustrating the operation of the present circuitry.

Briefly stated, the timer is essentially an oscillator which includes a pair of comparators 13 and 14, flip-flop 16, output logic circuitry 17, an active element 19 interposed between the flip-flop and the input reset terminal, a discharge circuit made of an active element 21. The timer 11 may be in the form of a monolithic integrated circuit chip with appropriate number of terminal pins 1, 2, 3, 4, 6, 7 and 8 as schematically illustrated. (It is noted here that the numerical designation of the terminal pins correspond to conventional designations widely accepted in the industry.) The terminal 1 is for grounding for the chip when connected. Terminal 3 is used for the output of the chip and terminal 4 is for receiving the input and is commonly designated as the reset terminal. The reset terminal is coupled to the active element 19 which becomes conductive or nonconductive in response to the low or high voltage applied to the reset terminal 4. When the low voltage is applied to the reset terminal 4, the active element 19 is turned on and the timer is placed in its quiescent stable state. When the input voltage to the reset terminal 4 is high, the active element 19 switches into non-conducting state and this sets the timer 11 into active state and thereby enables it to generate output pulse train via its output terminal 3. The output terminal 3 is connected to the flip-flop through the output circuitry 17. The output circuitry may be in the form of digital circuitry providing an output of negative going pulse train $E_{OUT}$, as shown in FIG. 2. As illustrated, terminal 8 is used to connect the timer 11 to the DC power source, $V_{CC}$. Terminal 2 is interposed between the comparator 14 and the capacitor C of the timing circuitry RC. Terminal 2 is used to apply the triggering signal that enables the timer to generate the negative going train of pulses in its output. The terminal 6 interposed between the comparator 13 and the RC timing circuitry is used to provide threshold signal to the timing circuitry 11. Terminal 7 is used to provide a discharge path via the active element 21 for the timer 11.

The various circuit elements of the timer 11 are operatively coupled in a conventional manner with the RC timing circuitry so that when a reset signal is applied to its reset terminal 4, that is, when the high voltage signal is applied to the active element 19 via its reset terminal 4, the timer 11 generates a train of negative going pulses via its output terminals 3. By adjusting the RC timing circuitry, the frequency or period of the timer output $E_{OUT}$ can be set in a wide range of frequency. For example, the timer can be set to provide its output frequency from days to hours, to a fraction hours or seconds up to a frequency of 100 KHz by adjusting the timing circuitry parameters, namely, by adjusting the resistance or the capacitance of the RC circuitry in a conventional manner. For the more detailed description of the timer and its operation one may refer to the Specifications and Applications information found at pages 8-294 through 8-300 of the catalog entitled, "LINEAR INTEGRATED CIRCUITS DATA BOOK" 3rd Edition, November 1973, published by Motorola, Inc.

In accordance with an aspect of the present invention, the timer of the aforementioned type is advantageously utilized in conjunction with a control circuitry 31 of a novel design interposed between the timer and the input signal source $E_{IN}$ so that the timer functions as a locked frequency divider, multiplier or phase shifter. Whether the circuitry functions as a divider or multiplier or phase shifter is made to depend upon the ratio of the frequency of the input signal $E_{IN}$ and the repetition rate of the output pulse train $E_{OUT}$ provided by the timer.

Generally stated the control circuitry 31 is adapted to provide a reset signal to the reset terminal 4 in a controlled manner in response to two input conditions. One input condition is supplied by the input signal, $E_{IN}$, and the other input condition is supplied by the timer output, $E_{OUT}$, of the timer itself. The control circuitry is designed to respond to the two inputs $E_{IN}$ and $E_{OUT}$. $E_{OUT}$ is locked to the $E_{IN}$ and $E_{IN}$ is frequency multiplied, or divided, depending upon the ratio of the frequency of $E_{IN}$ and $E_{OUT}$.

As illustrated, the control circuitry 31 includes various circuit elements, namely resistors R1, R2, R3, R4, and R5 and active elements such as transistors Q1, Q2, Q3 and unidirectionally conducting elements, such as diodes D1, D2 and D3, operatively connected as shown to provide the various circuit functions. The control circuitry includes a reset terminal control circuit comprised of the circuit elements R3, R4, D2, D3 and Q3 designed to apply the high or low level voltage to the reset terminal 4. The voltage level of the output of Q3 at its collector terminal are placed under the control of the voltage state at a point A which serves as a common node that responds to the state of the input voltage, $E_{IN}$, and the state of the voltage of the timer output, $E_{OUT}$.

The circuit elements $R_1$, $R_2$, $Q_1$ and $D_1$ are connected to serve as an interface between the input signal $E_{IN}$ and the common node point A. When $E_{IN}$ is at a level below certain threshold voltage, $Q_1$ is held in the nonconductive state. Consequently the voltage at the collector terminal of $Q_1$ is high and the diode D1 is reverse biased. When the input $E_{IN}$ exceeds the threshold level, $Q_1$ becomes conductive and thereby forward biases the diode D1 and causes it to conduct. The conduction and nonconduction of the $Q_1$ therefore depends on whether or not $E_{IN}$ is below or above the Q1 threshold voltage (see FIG. 2). Thus, the voltage at the common point node point respond to the change in the voltage level of $E_{IN}$ below or above the threshold.

Q3 is normally conductive with timer 11 at its quiescent stable state. Under this condition, the first or high voltage level at the common node point A is established and fixed by the voltage drop through D2, D3 and Q3 to ground. The second or middle level is fixed when Q1 and D1 conducts and third level when Q2 conducts. By appropriate choice of Q1, Q2, Q3 and D1, D2 and D3 which is well within the reach of one of ordinary skill, the three levels may be fixed at suitable levels. In this manner, the applicant was able to choose silicon type transistor and diode elements and connect them as shown so that they provide 1.8 volts, 0.8 volts, 0.2 volts for the first, second and third voltage levels respectively, for the node A.

The operation of the circuit may be best understood first by noting that once triggered into operation by an incoming signal $E_{IN}$, the timer 11 continues to generate its characteristic output, $E_{OUT}$ (see FIG. 2) until $E_{IN}$ is turned off. The start of the timer is triggered by the input $E_{IN}$, reaching threshold level and turning on Q1. This, in turn, causes $E_{OUT}$ to synchronize with the input $E_{IN}$, in the sense that the start of each of the output pulses, i.e., phase of the output pulses is definitely related to the phases of $E_{IN}$. Whether the circuitry acts as divider, or multiplier depends on the ratio of the frequency of the input and output and the frequency of the output is fixed by its RC timing circuit.

The following general relationship will assist one to understand the nature of operation of the present circuit:

(1) Under quiescent state of timer 11, Q3 conducts and Q1 and Q2 is off. Timer 11 output $E_{OUT}$ is low.

(2) When Q1 first conducts, Q3 turns off. With Q3 turned off, the timer starts and $E_{OUT}$ goes high which will cause Q2 to conduct. This lasts for the duration Δt1 set by charging period of the timer. $E_{OUT}$ goes low after Δt1 and stays low for Δt2, again set by the discharging period of the timer. The timer goes back high after Δt2 only if Q1 is conducting. The above takes place under the control of the control circuitry 31.

(3) When Q1 is turned off, and stays off, i.e., $E_{IN}$ stays below the Q1 turn-on-threshold, the next time Q2 goes off as a result of $E_{OUT}$ going low during Δt2, Q3 is turned on again. This causes Q3 to apply low voltage to timer 11. As long as this state stays, the timer stays in its quiescent state and waits for $E_{IN}$ to go above the $Q_1$ turn-on-threshold to repeat the process.

The unique nature of the present circuitry in providing the frequency locking operation will now be described. Suppose the timer is held in its quiescent state. Now $E_{IN}$ goes above the Q1 turn-on-threshold, the timer will again turn back on and repeat its astable mode of operation and generate its characteristic output pulse train. What the timer does is to generate the output, $E_{OUT}$, of a pulse train of a negative going pulses of a predetermined rate, the start of which is triggered when the first incoming wave applied at the input terminal exceeds the Q1 threshold. As is evident from FIG. 2, the timing of the start of the pulse train generated by the timer 11 is controlled by the input pulse train; as the input pulse train voltage amplitude exceeds the Q1 turn-on-threshold voltage, the control circuitry 31 triggers the reset terminal of the timer 11 into its astable state and causes it to conduct and operate in synchronization with the input, $E_{IN}$. Note that this synchronization takes place whether the input is of the sinusoidal wave or of the square wave or of the triangular or sawtooth wave. Note also that regardless of the waveform shape the output formed is essentially the same output ($E_{OUT}$) pulse train of a given repetition rate provided by the timer 11.

Now examples of the circuit functioning as a divider and multiplier will be described in conjunction with FIG. 1 and FIG. 2 A–F and $E_{OUT}$.

FIG. 2A illustrates a train of incoming pulses various shapes such as sinusoid, triangular and pulses of different widths and amplitude but having same frequency as the frequency of the timer output, $E_{OUT}$.

Now in operation: In the beginning Q1 and Q2 do not conduct and Q3 conducts. As the input reaches the Q1 turn-on-threshold, Q1 conducts. This turns off Q3 because the voltage drop through Q1 and D1 is smaller than that through D2, D3 and Q3. In turn, the voltage level at the node A goes from the first or high level (e.g., 1.8 volts) to the second or middle level (e.g., 0.8 volts) which is not high enough to keep Q3 on. With Q3 now off timer 11 is turned on and this makes $E_{OUT}$ go high at $t_1$. $E_{OUT}$ stays high for Δt1 duration. While $E_{OUT}$ stays high Q2 conducts and drives node point A further negative to the third or low level (e.g., 0.2 volts). While Q2 is conducting, the changing level of the input $E_{IN}$ can not affect the voltage level at the node point A. Node point A stays at the low third level. This is evident by comparing FIG. 2A with $E_{OUT}$ of FIG. 2 during the time $\Delta t1$.

When $E_{OUT}$ goes low at $t_2$ and stays low, Q2 is turned off. In case where the input frequency is the same as the timer output frequency the full input cycle coincides with the full cycle of $E_{OUT}$, that is, for the duration of high voltage duration $\Delta t1$ and the low pulse duration $\Delta t2$. Note that while $E_{OUT}$ is high and thus Q2 is conducting the negative half of $E_{IN}$ turning off Q1 does not affect the operation of Q3. This is the case whether the input is sinusoidal, square wave or triangular wave as evident from the comparison of FIG. 2A with FIG. 2, $E_{OUT}$. What has happened is that one period of oscillation of the $E_{IN}$ has come through Q1 for one period of oscillation of the timer. The timer has divided or multiplied by one, 1.

FIG. 2B shows an input having twice the frequency of the output, FIG. 2 $E_{OUT}$. Before the first cycle of the input wave is over, the timer turns and holds Q2 on. When the second period of the input is applied to turn on Q1, the timer is already held in the on condition by Q2. By the time the third waveform period of the input is applied the timer has completed its period of oscillation, turned off, and is waiting for the third cycle to start. Q1 conducts again at $t_3$ at the beginning of the third cycle and causes Q3 to turn off. This causes the timer to go on and generate a second cycle of its output. What has happened is that two periods of oscillation of the $E_{IN}$ has come through Q1, for one period of oscillation of the timer. The timer divides the input by two, ÷2.

FIG. 2B also shows pulsed, square waves, trapezodial waves and last of all very sharp pulses as an input waveform that is twice the frequency of the output. But the output wave form, $E_{OUT}$, is the same. The turn-on time is determined by the time it takes for $Q_1$ to turn on and the node point "A" to reach 0.2V. Since there are no inductors or capacitors to limit the timer or the external circuitry from turning on this time should be extremely small and is really limited by the transistors themselves.

Now suppose, for example, that the input is a series of negative going pulses that is 3 times for every two cycles of the output frequency as shown in FIG. 2C. The present circuit divides by 1.5. Thus, the input turns Q1 on as it reaches threshold at t1. This turns on the timer. During the time period of the second cycle of the input, the first period of oscillation of the timer is completed and consequently during $\Delta t2$ Q2 is not conducting. But, Q1 is conducting and keeping the node point A at 0.8 volts level which keeps Q3 turned off. During $\Delta t2$ $Q_1$ is turned on by the second cycle of the input signal, the node point "A" of FIG. 1 merely increases in voltage to +0.8V from +0.2V when expressed in terms of the aforementioned example. The +0.8V held $D_2$, $D_3$, and Q3 off keeping the reset terminal high. This allows the timer to continue on into a second period of oscillation.

When the second period of oscillation of the timer was over the third negative pulse of the input had already turned $Q_1$ OFF. So, therefore, the timer at the end of its second period of oscillation had no input to keep it going and finally turns itself OFF going back to its static state waiting for the fourth cycle of the input to turn $Q_1$ back ON and repeat the process. In this manner, the circuit of FIG. 1 has just divided the input versus the output by 1.5, an uneven integer, and at the same time the timer has also locked itself to the incoming frequency.

The same circuit can divide by 2.5 or 1.333 or 0.666 or any uneven integer. However, at the completion of division the negative input pulse can only appear in the same time frame as the negative output pulse of the timer. Therefore for a particular division ratio the width of the input pulse must be maintained for desired operation.

As shown above the circuit of FIG. 1 will divide by an uneven, or even integer or non integer number such as 1.5. There is a limit to the number, however. That is determined by ratio of the timer being on to the timer being off. If the time of a complete cycle of the input is equal to the natural off time of the timer which is equal to the discharge time of C then the divider could become unstable.

Let's suppose, for example, that the input frequency was lowered to one half the frequency of the output as shown in FIG. 2D. In principle the same thing is happening here to the circuit of FIG. 1 as was happening during the division of an uneven integer with the exception that $Q_1$ is now being held ON by the input until the completion of the second period of oscillation of the timer.

In this instance the output of the circuit of FIG. 1 doubled the incoming frequency and at the same time has locked itself to that frequency. One could continue lowering the input frequency or increasing the natural frequency of the timer by changing R and R' and C to come up with different multiplication ratios of the input. But, suppose a multiplication of an uneven integer that is greater than one is desired. Let's suppose now that we increase the input frequency of FIG. 2D to that of FIG. 2E. In this case, the circuit of FIG. 1 will operate in a manner similar to the way it divides by an uneven integer except in this case, it multiplies by 1.5 and also locks to the input frequency. Thus, the circuit can multiply by integer or non-integer numbers. The same cautionary notes that applied to the division of an uneven integer also applies for the multiplication of an uneven integer, i.e., for the particular multiplication ratio, the width of the negative input pulses will have to be maintained.

FIG. 2F is essentially the same as FIG. 2E except that it is a sawtooth wave that is used for the input. This same sawtooth waveform can be used for the division of even integer multiplication examples also.

Now referring to another aspect of the present circuitry, it will be shown that the present circuit can perform phase shifting function as follows.

Suppose the input is a sine wave as shown in FIG. 2B and its amplitude decreases. The slope of the sine wave will decrease and $Q_1$ will turn on at different point on the slope of the sine wave. This causes a change in the phase difference between input versus output but the timer is still locked to the input signal. Therefore, by varying the amplitude of the sine wave a frequency locked phase shift will occur between input and output. A difference phase shift will also occur if the amplitude of the sine wave of FIG. 2B would change or the amplitude of the sawtooth of FIG. 2F would change.

Theoretically, a phase shift of ±180° can be made to occur by using a sawtooth waveform or by applying base bias to $O_1$ to change the threshold point.

Inprovements over the prior art providing the same or similar results in the division of uneven integers and the multiplication functions are these. The prior art circuits require tuned circuits, flip-flops, or unijunction transistors (UJT) oscillators in one circuit. The flip-flop and the UJT could be synchronized to an input frequency but they can not divide or multiply by an uneven integer or fractions of a number.

The present Phase Shifter has improvements over the prior art in that for a divide by ONE or multiply by ONE, the present circuit makes no use of tuned circuits other than the basic timing circuit of the timer, R and R' and C of FIG. 1. Instead the present circuit uses the voltage level of the input signal or the DC bias of the $Q_1$ threshold voltage, or a combination of both. With this technique, the phase shift can be varied to any point from ±180°.

The control circuitry 31 within the dotted line of FIG. 1 in combination with the use of the 555 timer 11 shown as an example could easily be integrated into a single chip to create a new integrated circuit.

The advantages of the new structure is that in one basic circuit a locked frequency divider, multiplier, and basic phase shifter has been created without changing a single circuit element with the exception of R and C of the timer for change the operating frequency of the circuit. The circuit as shown not only will lock to an incoming frequency but will divide or multiply the frequency by whole numbers or fractions of whole numbers and remain locked or synchronized to the incoming frequency. Once the input signal has overcome the $Q_1$, threshold point the amplitude of the input signal becomes irrelevant and is only limited by the base-to-emitter open voltage, $V_{EBO}$, with Q1 conducting. In many trigger circuits the circuit is trigger amplitude sensitive i.e., if the trigger voltage is too large in amplitude the circuit could misfire. Not so in this circuit. Once $Q_1$ has triggered and the timer has started, the $Q_1$ trigger circuit is essentially isolated by diode $D_1$ from the rest of the circuit.

Basic phase shifts, if it is necessary between the output versus the input, can be created that can also be controllable and predicted using the present circuit. However, if more elaborate phase shifting is required, Q1 could be biased with conventional "H" bias, i.e., a resistor from the base of Q1 to $V_{CC}$ and another resistor from the base of Q1 to ground to establish a more predicted bias point for Q1.

The basic circuit of FIG. 1 may be modified without departing from the spirit and scope of the present invention. For example, $Q_1$ could either be replaced or preceded by an operational amplifier with DC output offset adjustment to more closely control the $Q_1$ threshold point and therefore make the entire circuit more predictable over temperature and also increase the phase shift technique described herein if necessary. While the circuit is shown to use NPN type transistors, PNP or FET's transistors could be used also.

Two more diodes could be added to the circuitry, one in series with $D_1$ and the other in series with $D_2$ and $D_3$. This would insure more isolation between $Q_1$ and $Q_2$ when $Q_2$ is overriding $Q_1$. In this manner 0 volts would be across two diodes instead of just one diode. Q3 could be changed to a totem pole output circuitry of conventional nature.

With the available "555" timer, the present circuitry was found to be capable of providing the output of up to 100 KHz. This limitation was essentially found to be due to the limitation of the timer.

If the timer can operate in the megacycle region, then the applications of the present circuit will be found not only in digital electronics but also in communication equipment for local oscillators, digital synthesizors, or in any equipment that needs a multiple of locked frequencies that is phase shiftable up to ±180°.

Various other changes and modifications may be made to the present circuitry without departing from the spirit and scope of the present invention by a person of ordinary skill. For example, as evident from the foregoing, the present control circuitry can function with other types of astable oscillators having suitable timing circuitry.

What is claimed is:

1. A circuit for controlling the operation of a timer with a timing circuit operating in an astable mode and providing a train of output pulses from an output terminal, comprising:
a control circuit having an input terminal, said control circuit being interposed between an input signal on said input terminal and the timer to perform one of the functions of multiplying and dividing of the input signal frequency according to the ratio between the input frequency and the frequency of the train of output pulses, wherein said timer includes a reset terminal settable at a first voltage level for causing the timer to be set to a quiescent state and settable at a second voltage level for causing the timer to be set in an astable mode to provide the train of output pulses, and wherein said control circuit is responsive to said input signal and the output pulses of the timer to apply the first and the second level voltages selectively to said reset terminal for enabling the timer to perform one of said functions of multiplying and dividing of the input signal.

2. The circuit according to claim 1 wherein said train of output pulses is of a predetermined repetition rate which is set by a resistor-capacitor of the timing circuit, and wherein
said control circuit includes a reset control circuit for applying said first and said second voltage levels selectively, an interface circuit having an output, said interface circuit being interposed between said input terminal and the reset control circuit and a feedback circuit having an output, said feedback circuit being interposed between said reset control circuit and the output terminal of the timer whereby the operation of the reset control circuit is responsive to the input signal and the output of the timer selectively.

3. The circuit according to claim 2, wherein the outputs of said interface circuit and said feedback circuit are connected to an input of said reset terminal control circuit at a common node whereby the voltage at the common node is placed under the control of the input signal and the voltage level of the timer output selectively.

* * * * *